United States Patent
Ma

(10) Patent No.: US 8,624,645 B2
(45) Date of Patent: Jan. 7, 2014

(54) MULTI PHASE CLOCK SIGNAL GENERATOR, SIGNAL PHASE ADJUSTING LOOP UTILIZING THE MULTI PHASE CLOCK SIGNAL GENERATOR, AND MULTI PHASE CLOCK SIGNAL GENERATING METHOD

(75) Inventor: Yantao Ma, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 171 days.

(21) Appl. No.: 13/210,356

(22) Filed: Aug. 15, 2011

(65) Prior Publication Data

US 2013/0043918 A1    Feb. 21, 2013

(51) Int. Cl.
*H03K 5/01* (2006.01)
*H03K 3/00* (2006.01)

(52) U.S. Cl.
USPC ............................. 327/165; 327/296; 331/18

(58) Field of Classification Search
USPC ............... 327/165, 296, 295; 331/16, 17, 18
See application file for complete search history.

(56) References Cited

U.S. PATENT DOCUMENTS

| | | | | |
|---|---|---|---|---|
| 4,641,048 A * | 2/1987 | Pollock | ......................... | 327/262 |
| 5,592,126 A * | 1/1997 | Boudewijns et al. | ........... | 331/45 |
| 5,596,302 A * | 1/1997 | Mastrocola et al. | ............ | 331/57 |
| 5,635,880 A * | 6/1997 | Brown | ...................... | 331/108 B |
| 6,559,727 B2 * | 5/2003 | Boerstler | ........................ | 331/57 |
| 6,897,699 B1 * | 5/2005 | Nguyen et al. | ................. | 327/295 |
| 7,321,269 B2 * | 1/2008 | Drake et al. | .................... | 331/57 |
| 7,659,783 B2 * | 2/2010 | Tai | ................... | 331/17 |
| 7,808,295 B2 * | 10/2010 | Sakiyama et al. | ............ | 327/333 |
| 8,004,335 B2 * | 8/2011 | Kim et al. | ..................... | 327/231 |
| 2012/0182057 A1 * | 7/2012 | Ma et al. | ....................... | 327/276 |

\* cited by examiner

*Primary Examiner* — Ryan Jager
(74) *Attorney, Agent, or Firm* — Winston Hsu; Scott Margo

(57) ABSTRACT

A multi-phase clock signal generator, comprising: a ring phase shifting loop, including a plurality of controllable delay cells, for generating output clock signals having different phases via the controllable delay cells according to a input clock signal, wherein delay amount of the controllable delay cells are determined by a biasing voltage; a phase skew detecting circuit, for computing phase differences of the output clock signals to generate a phase skew detecting signal; and a biasing circuit, for providing the biasing voltage according to the phase skew detecting signal. The above-mentioned ring phase shifting loop can operate independently from the multi-phase clock signal generator, without receiving the biasing voltage, for phase-shifting a input clock signal to generate output clock signals with different phases, wherein the output clock signals are respectively output at different output terminals respectively located between the phase shifting units.

22 Claims, 16 Drawing Sheets

MULTI PHASE CLOCK SIGNAL GENERATOR, SIGNAL PHASE ADJUSTING LOOP UTILIZING THE MULTI PHASE CLOCK SIGNAL GENERATOR, AND MULTI PHASE CLOCK SIGNAL GENERATING METHOD

BACKGROUND OF THE INVENTION

1. Field of the Invention

The present invention relates to a multi-phase clock signal generator, a signal phase adjusting loop utilizing the multi-phase clock signal generator, and a multi-phase clock signal generating method, and particularly relates to a multi-phase clock signal generator comprising a ring phase shifting loop, a signal phase adjusting loop utilizing the multi-phase clock signal generator, and a multi-phase clock signal generating method.

2. Description of the Prior Art

A multi-phase clock signal generator is always applied to the electronic apparatus needing clock signals with different phases, such as a DDR (double date rate) ram.

However, the circuit or method for generating multi-phase clock signals always needs huge circuit region or complicated design. For example, a quadratur PLL utilizing a quadrature oscillator may be utilized to generate multi-phase clock signals. However, a frequency of the quadrature oscillator is controlled by voltage and very sensitive to supply voltage noise. Also, a frequency of the quadrature oscillator is not actively driven by external clock frequency and is free running. Also, such structure needs a large circuit region and high power consumption.

Also, an analog multi-phase generator utilizing a delay chain controlled by a charge pump is also utilized to generate multi-phase clock signals. However, such circuit also has huge circuit area and may induce high power consumption. Besides, analog logic is relatively difficult for process portability, sensitivity for high yield in mass production.

Additionally, phase skew problems may exist in the multi-phase clock signals. The phase skew problems are difficult in achieving high accuracy. For example, some prior arts may utilize a plurality of delay lock loops to correct the phase skew issue. However, such structure needs a large circuit size, high power consumption and very complicated control logic. The locking time is too long, which is not appropriate for high speed applications.

SUMMARY OF THE INVENTION

One objective of the present application is to provide a multi-phase clock generator with small circuit size and very low power consumption.

Another objective of the present application is to provide a multi-phase clock generator that can correct phase skew issue.

One embodiment of the present application provides a multi-phase clock signal generator, comprising: a ring phase shifting loop, having a plurality of output terminals and phase shifting units, for phase-shifting a input clock signal to generate output clock signals with different phases, wherein the output clock signals are respectively output at different output terminals respectively located between the phase shifting units.

Another embodiment discloses a signal phase adjusting loop, comprising: a multiphase generator, comprising: a ring phase shifting loop, having a plurality of output terminals and phase shifting units, for phase-shifting the delayed input clock signal to generate output clock signals with different phases, wherein the output clock signals are respectively output at different output terminals; and a phase adjusting circuit, for receiving one of the output clock signals and a input signal, to adjust a phase of the input signal according to a phase of the one of the output clock signals.

Another embodiment discloses a multi-phase clock signal generating method, comprising: (a) providing a plurality of phase shifting units to form a ring phase shifting loop; (b) utilizing the phase shifting units to phase-shift a input clock signal to generate output clock signals with different phases; and (c) selecting at least one part of output terminals respectively between the phase shifting units to output the selected output clock signals.

Another embodiment discloses a multi-phase clock signal generator, comprising: a ring phase shifting loop (801), including a plurality of controllable delay cells, for generating output clock signals having different phases via the controllable delay cells according to a input clock signal, wherein delay amount of the controllable delay cells are determined by a biasing voltage; a phase skew detecting circuit (805), for computing phase differences of the output clock signals to generate a phase skew detecting signal; and a biasing circuit (803), for providing the biasing voltage according to the phase skew detecting signal.

Another embodiment discloses a multi-phase clock signal generating method, comprising: generating output clock signals having different phases via at least one controllable delay cells according to a input clock signal, wherein delay amount of the controllable delay cells are determined by a biasing voltage; computing phase differences of the output clock signals to generate a phase skew detecting signal; and providing the biasing voltage according to the phase skew detecting signal.

In view of above-mentioned embodiments, accurate multi-phase clock signals can be generated by utilizing a small number of devices. Circuit layout size and power consumption can minimized. Meanwhile, the resolution of the multi-phase clock signals can be pre-selected via changing the integer N. The frequency of the multi-phase clock signals is only determined by external clock signal and will not be affected by supply voltage noises. Additionally, via utilizing the phase skew sensing mechanism according to the present application, the phase skew difference can be linearly sensed to adjust the outputs phase skew.

Via utilizing feedback biasing voltage, high phase skew accuracy through ultra wide range operating frequency can be acquired. Actively driven balanced Bias generation concept is for Power down saving mode, which maintains prior Bias information before entering power down.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
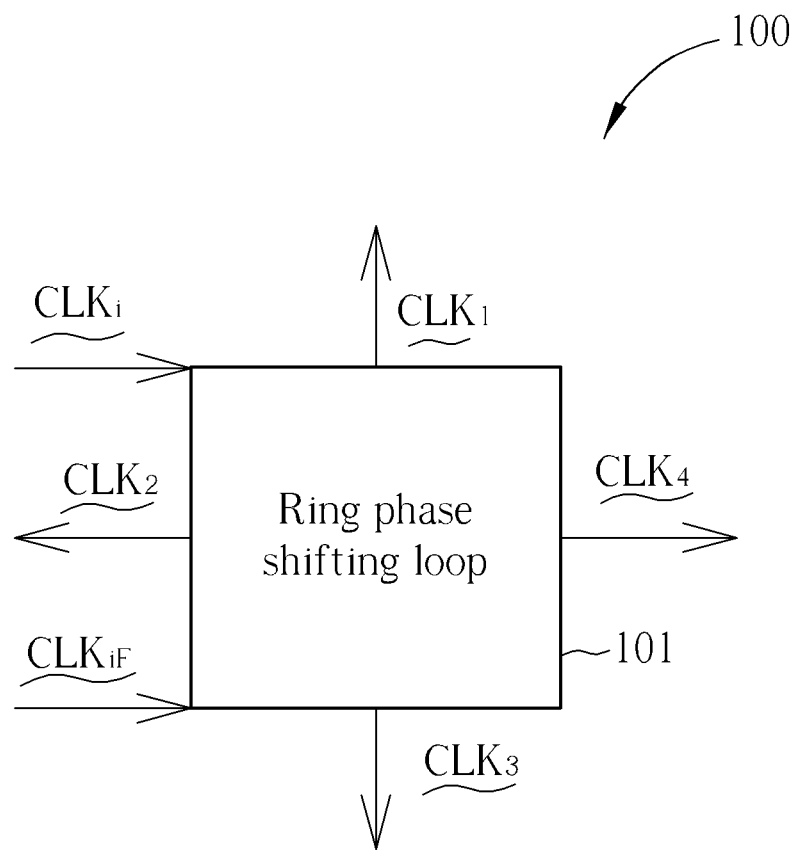
FIG. 1 is a block diagram illustrating a multi-phase clock signal generator according to the embodiment of the present application.

FIG. 1 is a block diagram illustrating a multi-phase clock signal generator 100 according to one embodiment of the present application. As shown in FIG. 1, the multi-phase clock signal generator 100 includes a ring phase shifting loop 101, which has a plurality of output terminals and phase shifting units, for phase-shifting a input clock signal $CLK_i$, $CLK_{iF}$ to generate output clock signals $CLK_1$, $CLK_2$, $CLK_3$ and $CLK_4$ with different phases. The input clock signal $CLK_i$ and $CLK_{iF}$ is a differential signal in this embodiment, but it can be a single ended signal in other embodiments. The output clock signals $CLK_1$, $CLK_2$, $CLK_3$ and $CLK_4$ are respectively output at different output terminals. The number of the output clocks and the out put terminals are 4 in this example. The output clock signals $CLK_1$, $CLK_2$, $CLK_3$ and $CLK_4$ are generated based on external clock signals (i.e. the input clock signal $CLK_i$ and $CLK_{iF}$). The ring phase shifting loop 101 idles if no external clock signals are transmitted to the ring phase shifting loop 101.

FIG. 2-FIG. 5 are circuit diagrams illustrating detail structures of the block diagram shown in FIG. 1, according to embodiments of the present application. The common feature of the embodiments shown in FIG. 2-FIG. 5 is that the ring phase shifting loop has a plurality of phase shifting units arranged to form a ring, and has a plurality of output terminals located between phase shifting units the to output the output clock signals with different phases. The detail circuit structures thereof are described in the following.

Figure 2A:
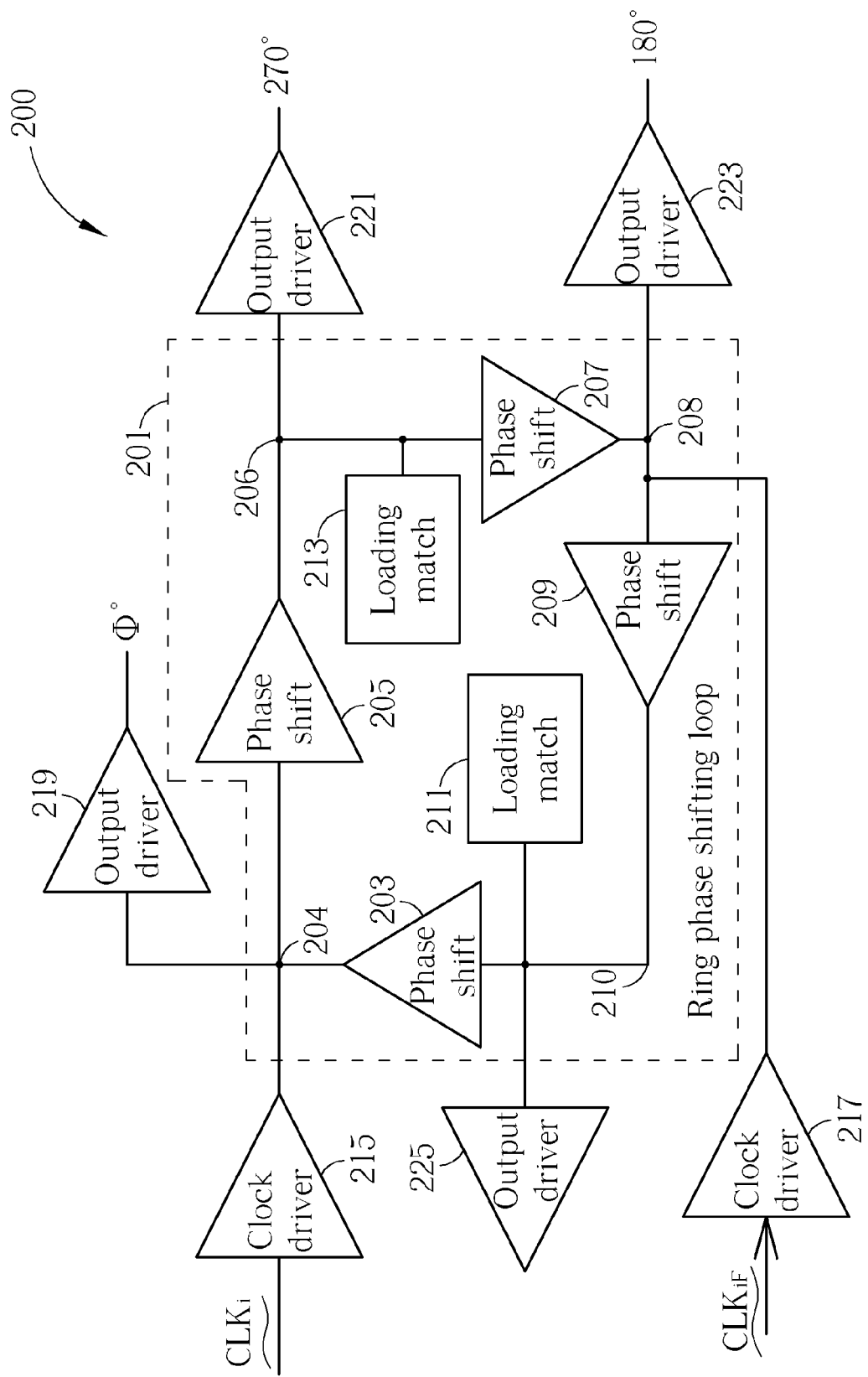
FIG. 2-FIG. 5 are circuit diagrams illustrating detail structures of the block diagram shown in FIG. 1, according to embodiments of the present application.

In the embodiment shown in FIG. 2A, the ring phase shifting loop 201 has four phase shifting units 203, 205, 207, and 209 arranged in a ring. Also, the ring phase shifting loop 201 includes a plurality of output terminals 204, 206, 208 and 210 respectively locating between the phase shifting units 203, 205, 207, and 209. Additionally, the ring phase shifting loop 201 includes a plurality of loading match components 211 and 213, coupled to the output terminals 204, 206, 208, 210 and the phase shifting units 203, 205, 207, and 209. The phase shifting units 203, 205, 207, and 209, which are phase mixing units for phase mixing in this example, serve to phase splitting and interpolating the input clock signal $CLK_i$ and $CLK_{iF}$ to generate clock signals with different phases. Please note that the phase shifting units 203, 205, 207, and 209 can be drivers inside the ring phase shifting loop 201. The loading match components 211 and 213 serve to provide balanced loading to the ring phase shifting loop 201, such that the clocks signals at the output terminals 204, 206, 208 and 210 can have desired phase shift. In this embodiment, the output clock signals respectively have 0°, 90°, 180° and 270° phase difference from the input clock signal $CLK_i$. That is, the multi-phase clock signal generator 200 has an integer N=4. Please note that the inter N can be changed, if the number of phase shifting units is changed or the selected output terminal number is changed.

Besides the ring phase shifting loop 201, the multi-phase clock signal generator 200 can include other devices such as the clock drivers 215, 217, and the output drivers 219, 221 and 223, but do not mean to limit the scope of the present application. The clock drivers 215, 217 serve to drive the input clock signal $CLK_i$ and $CLK_{iF}$, and the output drivers 219, 221 and 223 serve to drive the output clock signals such that the output clock signals can match the requirements of follow up processes.

Figure 2B:
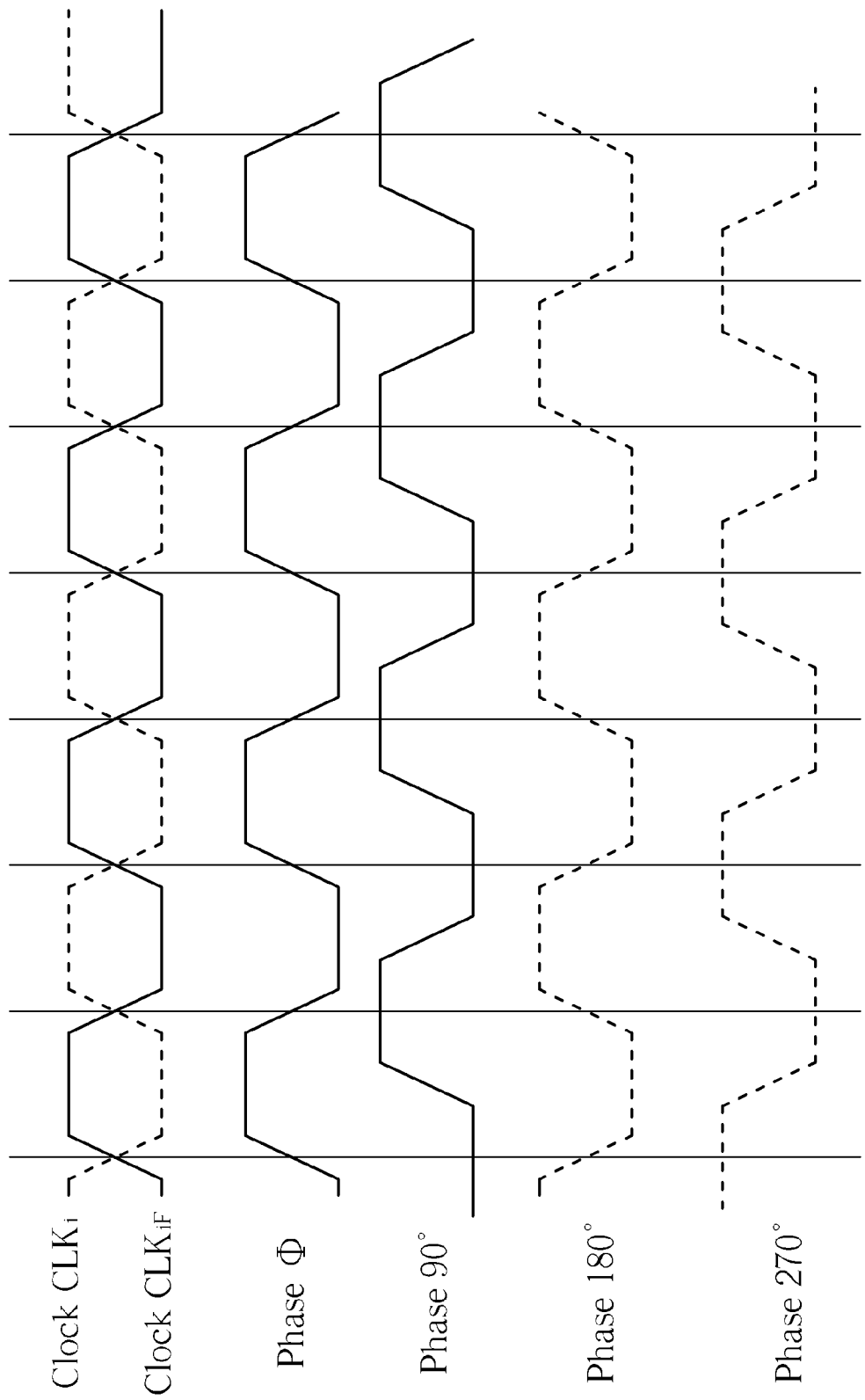

FIG. 2B is a schematic diagram illustrating the wave forms of the embodiments disclosed in FIG. 2A. As shown in FIG. 2B, the clock waveforms of phase φ, 90°, 180°, 270° respectively having 0°, 90°, 180° and 270° phase difference from the input clock signal $CLK_i$. Phase skews may exist between different clock signals due to the device delay or other reasons, but are ignored in FIG. 2B for brevity.

Figure 3:
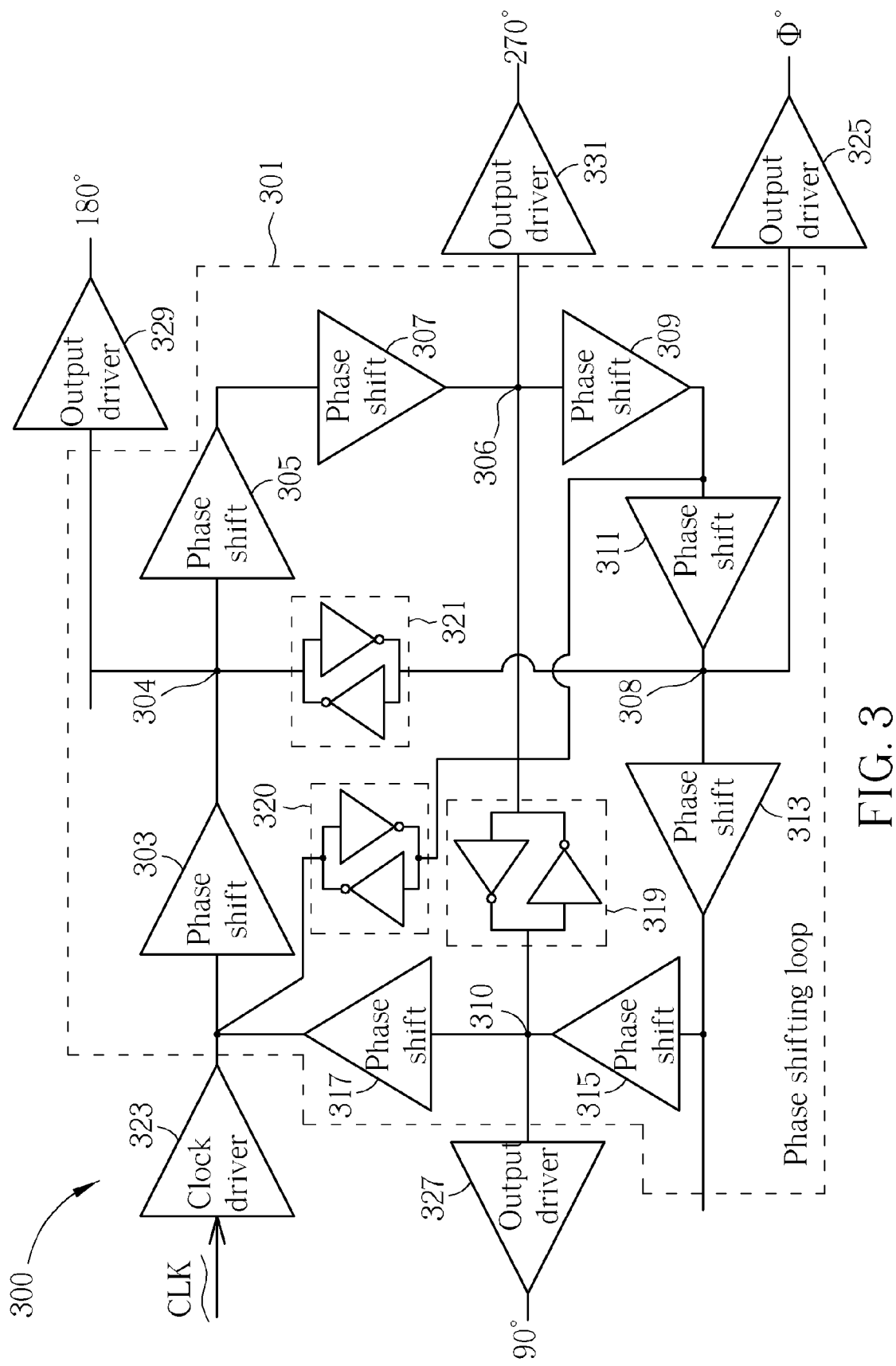

Please refer to FIG. 3, which is a circuit diagram according to another embodiment of the present application. In this case, the multi-phase clock signal generator 300 also includes a phase shifting loop 301, a clock driver 323, and output drivers 325, 327, 329 and 331. However, the structure of the phase shifting loop 301 is slightly different from which of the phase shifting loop 201. Eight phase shifting units 303-317, which are also phase mixing units in this example, are included in the phase shifting loop 301 rather than four phase shifting units in the embodiment of FIG. 2. Besides, the phase shifting loop 301 has latches 319 and 321, for fixing the phases of the clock signals at the output terminals 304, 306, 308 and 310, in addition with or without the loading match components in FIG. 2. Additionally, the input clock can be a single ended input signal here.

Although the phase shifting loop 301 has eight phase shifting devices, the phase shifting loop 301 still includes four output terminals 304, 306, 308 and 310. Such kind of structure calls are called a 2N structure, which means the number of the output terminals is half of the number of phase shifting units. It is especially useful for odd number of clock phase generation.

Figure 4:
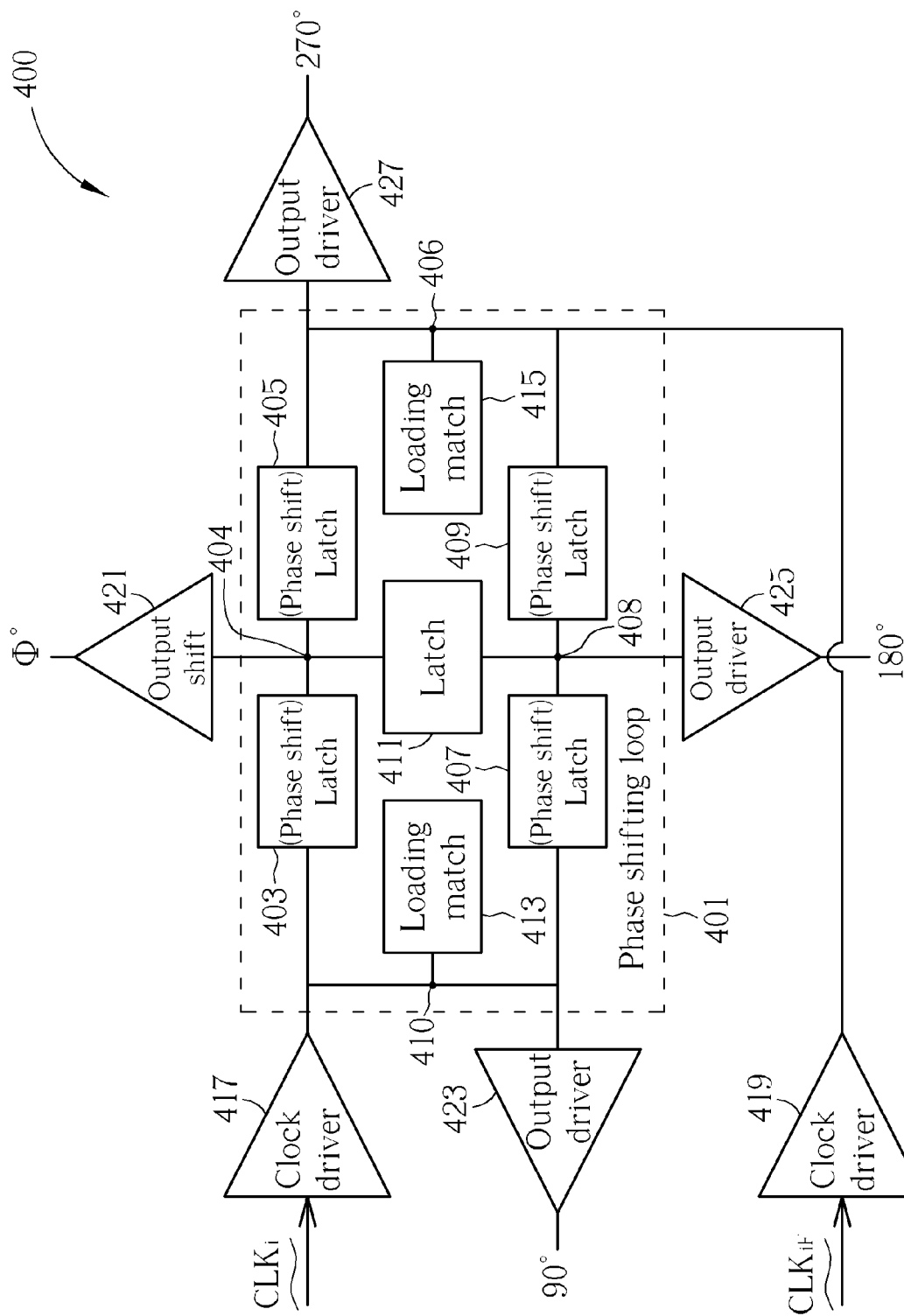

Please refer to FIG. 4, which is a circuit diagram according to another embodiment of the present application. FIG. 4 also discloses a phase shifting loop 401, clock drivers 417, 419 and output drivers 421, 423, 425 and 427. The phase shifting loop 401 includes latches 403, 405, 407, and 409. The latches 403, 405, 407, and 409, which serve as phase shifting units, latch phases the input clock signal such that it can output phase-shifted clock signal, to generate clock signals with different phases. The latch 411 can be a latch which's type is different from which of the latches 403, 405, 407, 409 and 411. Via utilizing latches as phase shifting units, the mismatches among output terminals can be reduced. The latch 411 serves to fix the phases of the clock signals at the output terminals 404, 406, 408 and 410. Also, the phase shifting loop 401 includes loading match units 413 and 415 to provide desired loading to the ring phase shifting loop 401, such that the clocks signals at the output terminals 404, 406, 408 and 410 can have desired phase shift. In this embodiment, the output clock signals respectively have 0°, 90°, 180° and 270° phase differences from the input clock signal $CLK_i$. The waveforms of the input clock signals CLKi, CLKiF, and output clock signals are the same as which in FIG. 2B. Thus it is omitted for brevity here.

Figure 5:
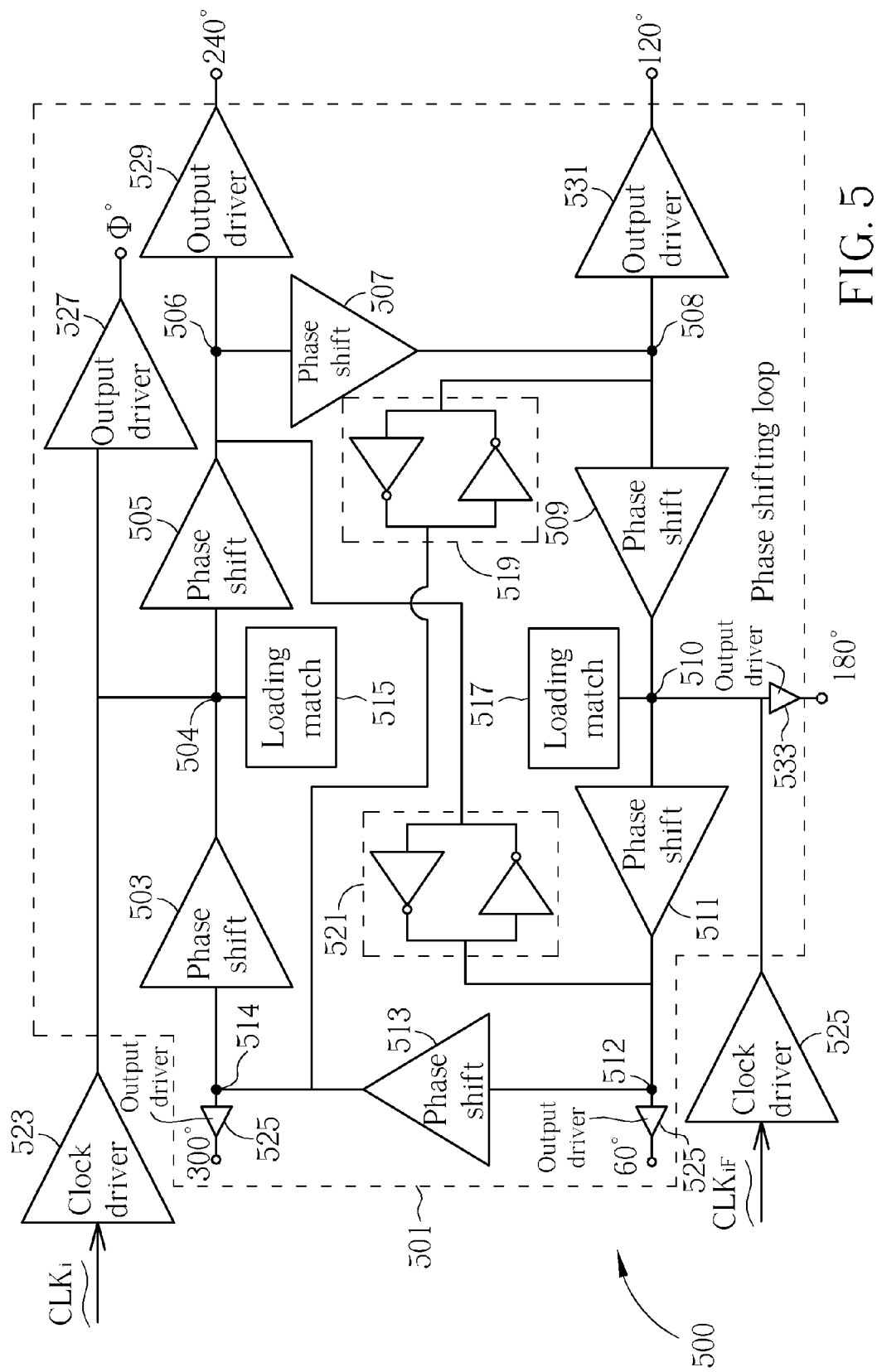

Please refer to FIG. 5, which is a circuit diagram according to another embodiment of the present application. As shown in FIG. 5, the multi-phase clock signal generator 500 includes clock drivers 523 and 525, and a phase shifting loop 501. The phase shifting loop 501 has six phase shifting units 503-513. Accordingly, the six output terminals 502, 504, 506, 508, 510, and 512 respectively output clocks signals having 0°, 60°, 120°, 180°240° and 300° phase differences from the input clock signal $CLK_i$. That is, the N in FIG. 5 is 6. Besides, the phase shifting loop 501 includes loading match components 515, 517, and latches 519, 521. All the clock phases are generated by mutual phase interpolating of CLKi and CLKif. Please note that the concept disclosed in FIG. 3 can be applied to the embodiment shown in FIG. 5. That is, the structure shown in FIG. 5 includes N=6, but it can be extended to N=2×3 or N=2×6. N=2×3 indicates that a number of the phase shifting units is 6 but a number of the output terminals is 3. Besides, N=2×6 indicates that a number of the phase shifting units is 12 but a number of the output terminals is 12. More phase shifting units are utilized, higher power the multiphase-generator circuit causes, but higher solution is acquired. On the contrary, less phase shifting units are utilized, lower power the multiphase-generator circuit causes, but lower solution is acquired.

Figure 6:
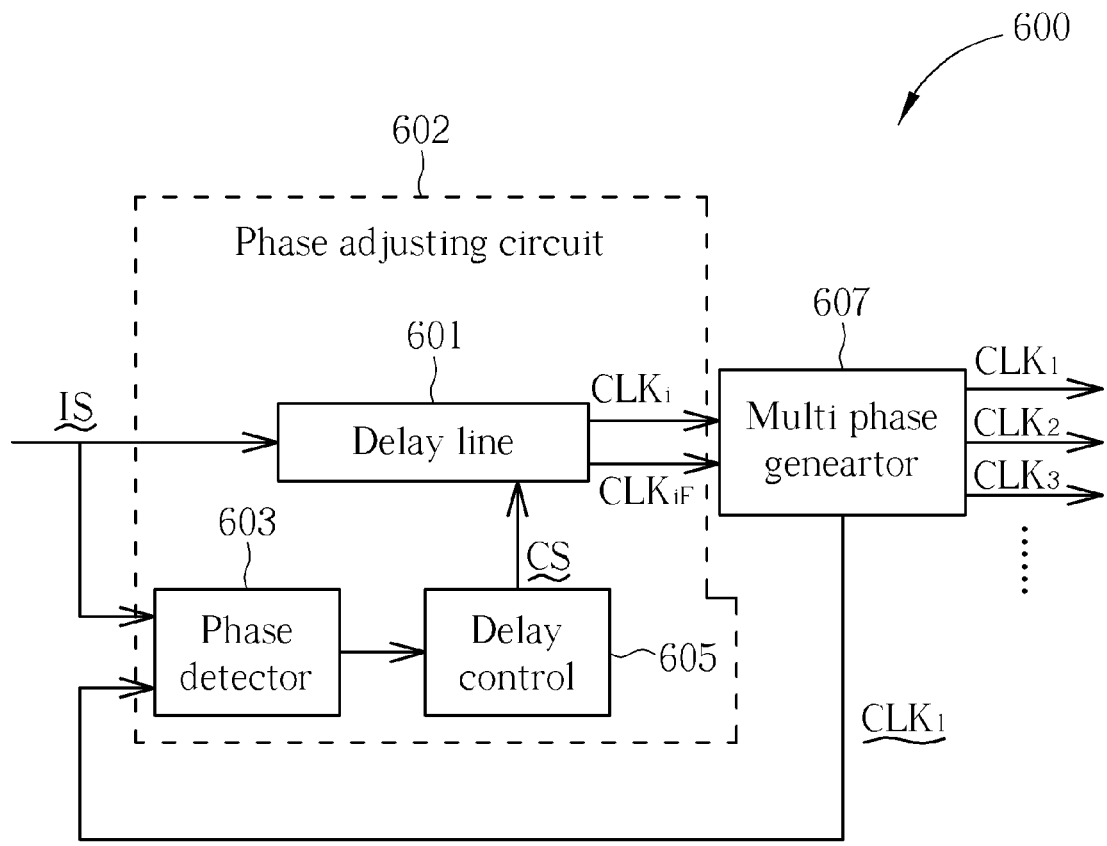
FIG. 6 is a block diagram illustrating how the multi-phase clock signal generator is applied to a DLL.
Figure 6:
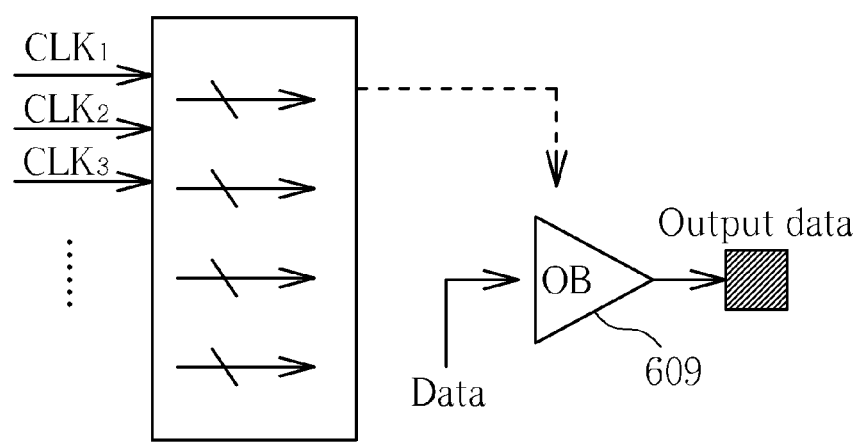

FIG. 6 is a block diagram illustrating how the multi-phase clock signal generator is applied to a DLL (Delay lock loop). Such a DLL can be applied to a memory device such as a DDR RAM, but not limited. As shown in FIG. 6, the delay lock loop 600 includes a controllable delay line 601, a phase detector 603 and a delay control circuit 605. The controllable delay line 601 delays an input clock signal IS to generate a delayed input clock signal $CLK_i$, CLKiF (i.e. the input clock signals in the embodiments of FIGS. 2, 4 and 5) according to a control signal CS. The controllable delay line 601 delays an input clock signal IS to generate a delayed input clock signal according to a control signal CS.

The multiphase generator 607, which can utilize the circuits shown in FIGS. 2A, 3, 4 and 5, generates a plurality of output clock signals $CLK_1$, $CLK_2$, and $CLK_3$ according to the delayed input clock signal $CLK_i$, CLKiF. The phase detector 603 receives a one of the output clock signals ($CLK_1$), which has a phase substantially the same as the delayed input clock signal $CLK_i$ and detects phases of the output clock signal $CLK_1$ and the input clock signal IS, to generate the phase difference information. The delay control circuit 605 generates the control signal CS to adjust the delay amount of the controllable delay line 601 according to the phase difference information. By this way, the multiphase generator 607 not only generates the output clock signal $CLK_1$, but can generate output clock signals with other phases for other purposes. For example, all the output clock signals $CLK_1$, $CLK_2$, $CLK_3$ ... can form a clock bus and proper logic to utilize it and transmitted to a data output buffer 609 to output data.

Please note that the multiphase generator 607 is not limited to be utilized in a DLL. It can be utilized to other signal phase adjusting circuit such as a PLL (Phase lock loop). The delay line 601, the phase detector 603 and the delay control circuit 605 can be regarded as a phase adjusting circuit 602. The phase adjusting circuit 602 receives the input clock signal IS and one of the output clock signals $CLK_1$, $CLK_2$, and $CLK_3$ .... Also, the phase adjusting circuit 602 adjusts the phase of the input clock signal IS according to the one of the output clock signals ($CLK_1$ in this embodiment). For a DLL, the phase adjusting circuit 602 includes the delay line 601, the phase detector 603 and the delay control circuit 605. However, if the multiphase generator 607 is applied to a PLL, the phase adjusting circuit 602 can include a phase detector, a charge pump, and a low pass filter. Such variation should also be included in the scope of the present application.

Figure 7:
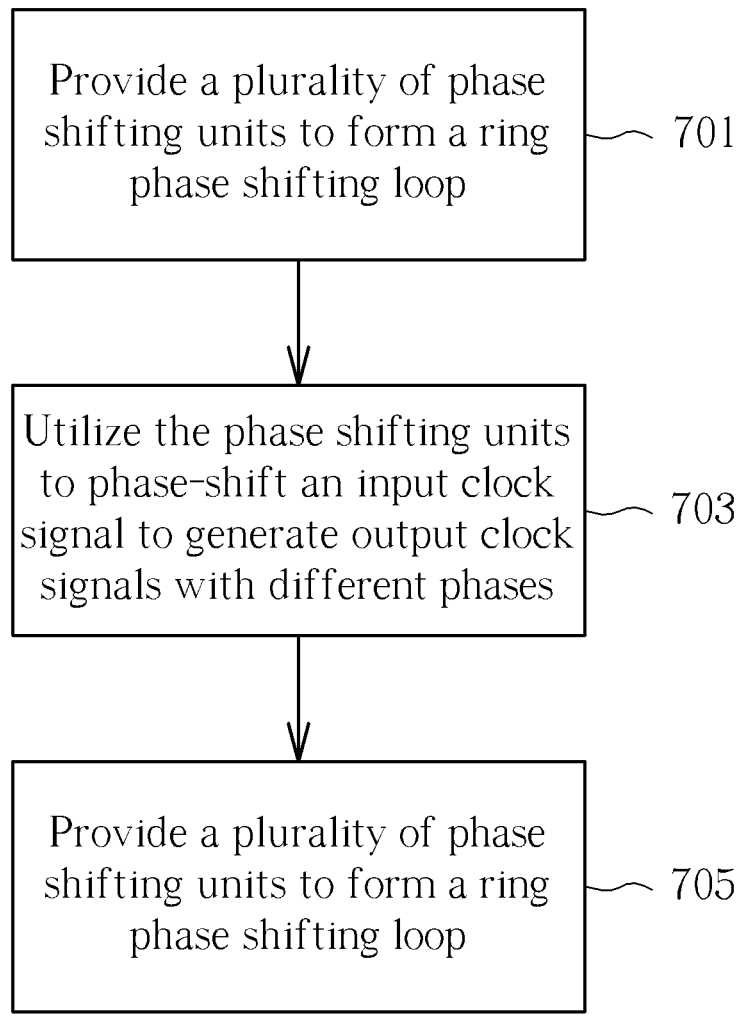
FIG. 7 is a flow chart illustrating a multi-phase generating method according to the embodiment of the present application.

In view of above-mentioned embodiments, a multi-phase generating method can be acquired. FIG. 7 is a flow chart illustrating a multi-phase generating method according to the embodiment of the present application. The multi-phase generating method includes steps of:

701

Provide a plurality of phase shifting units to form a ring phase shifting loop.

703

Utilize the phase shifting units to phase-shift an input clock signal to generate output clock signals with different phases.

705

Select at least one part of output terminals respectively between the phase shifting units to output the selected output clock signals.

Other detail steps of the multi-phase generating method shown in FIG. 7 can be easily acquired according to above-mentioned embodiments, thus are omitted for brevity here.

Figure 8:
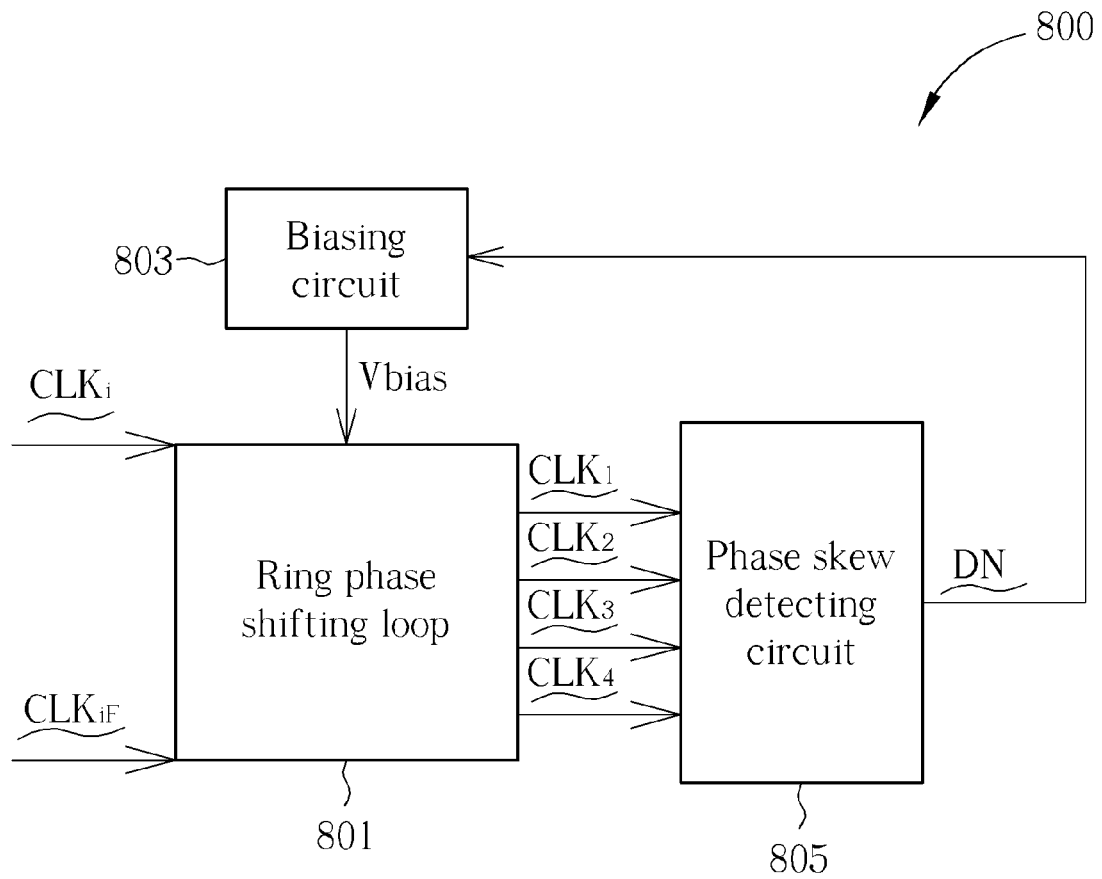
FIG. 8 is a block diagram illustrating a multi-phase clock signal generator 800 having a phase skew feedback mechanism according to an embodiment of the present application

Besides the above-mentioned concept, the present application further provides a mechanism using phase skew sensing feedback to maintain high phase skew accuracy through ultra wide range operating frequency. FIG. 8 is a block diagram illustrating a multi-phase clock signal generator 800 having a phase skew feedback mechanism according to an embodiment of the present application. AS shown in FIG. 8, the multi-phase clock signal generator 800 includes a ring phase shifting loop 801, a biasing circuit 803, and a phase skew detecting circuit 805. The phase skew detecting circuit 805 receives the output clock signals $CLK_1$, $CLK_2$, $CLK_3$ ... from the ring phase shifting loop 801 to generate a phase skew detecting signal $\Delta D_N$. The phase skew detecting signal $\Delta D_N$ is transmitted to the biasing circuit 803 to generate the biasing voltage $V_{bias}$. The $V_{bias}$ mentioned here may include bias voltages for both NMOS and PMOS devices, which are used for delay modulation purpose.

The ring phase shifting loop 801 have a plurality of controllable delay cells arranged in a ring, similar with the embodiments shown in FIG. 2A, FIG. 3-5. However, the delay cells of the ring phase shifting loop 801 can be controlled by the biasing voltage $V_{bias}$. By this way, the delay amount of the ring phase shifting loop 801 can be well adjusted according to the phase skew of the output clock signals, to generate accurate output clock signals.

Figure 9:
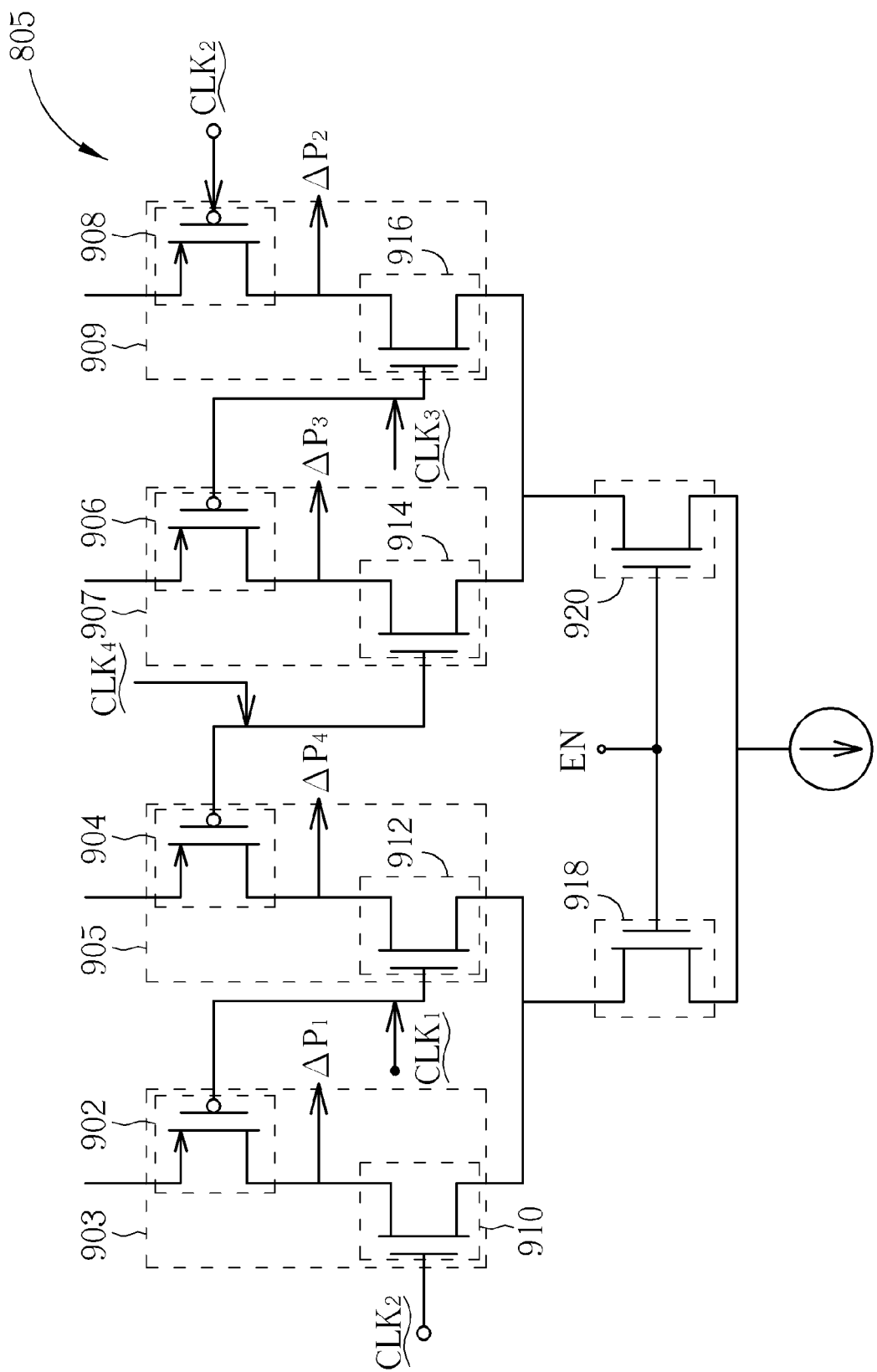
FIG. 9 is a circuit diagram illustrating detail structures of the phase skew detecting circuit shown in FIG. 8, according to one embodiment of the present application.

FIG. 9 is a circuit diagram illustrating detail structures of the phase skew detecting circuit shown in FIG. 8, according to one embodiment of the present application. As shown in FIG. 9, the phase skew detecting circuit 805 includes a plurality of detecting circuits 903, 905, 907, and 909, which respectively receives output clock signals $CLK_1$, $CLK_2$, $CLK_3$ . . . , to compute phase difference of the output clock signals $CLK_1$, $CLK_2$, $CLK_3$ . . . to generate phase difference signals $\Delta P_1$, $\Delta P_2$, $\Delta P_3$ and $\Delta P_4$. In this embodiment, the detecting circuits 903, 905, 907, and 909 respectively include PMOSFETs 902, 904, 906 and 908, and NMOSFETs 910, 912, 914 and 916. Please note that the scope of the present application is not limited to the order and connections of the PMOSFETs and NMOSFETs shown in FIG. 9. The connections can be rotated to match the Bias control circuitry as long as Phase skew sensing and bias decision make logic sense Please note that the switch devices 918 and 920 can be combined as one device or separated as shown in FIG. 9.

Besides, the phase skew detecting circuit 805 can further include switch devises 918 and 920 (in this embodiment, NMOSFETs) to receive an enable signal EN, to turn on/off the phase skew detecting circuit 805.

Figure 10:
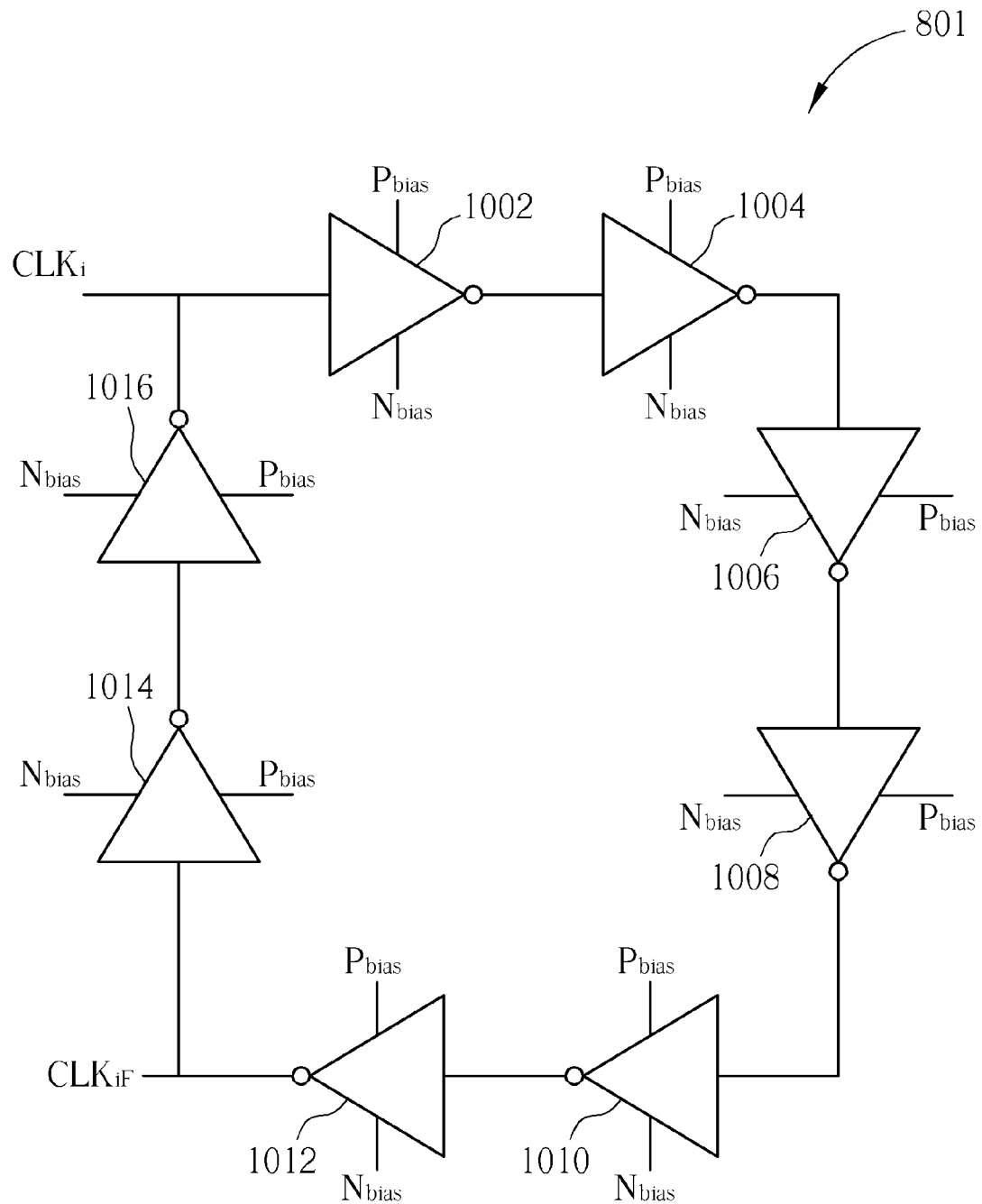
FIG. 10 is a circuit diagram illustrating the structures of the ring phase shifting loop 801 shown in FIG. 8, according to one embodiment of the present application.

FIG. 10 is a circuit diagram illustrating the structures of the ring phase shifting loop 801 shown in FIG. 8, according to one embodiment of the present application. As shown in FIG. 10, the ring phase shifting loop 801 includes a plurality of controllable delay cells 1002-1016 arranged in a ring. As above-mentioned, the number of delay cells and the location where the output clock signals are output can be adjusted. Also, at leas one latch can be provided between the terminals of the delay cells. The delay cells 1002-1016 receive biasing voltage $V_{bias}$, which are classified into $P_{bias\ and\ Nbias}$ in this embodiment, such that the delay amount of the delay cells 1002-1016 can be adjusted.

Figure 11:
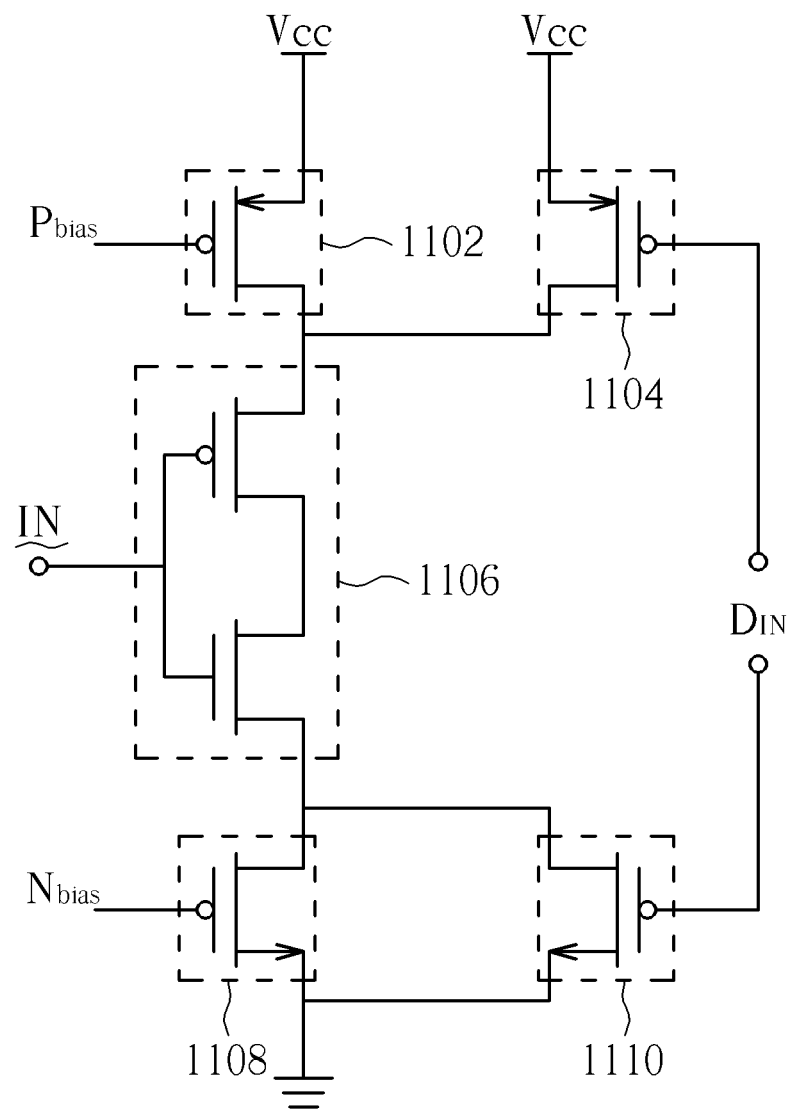
FIG. 11 is an example of a circuit structure of the controllable delay cells

FIG. 11 is an example of a circuit structure of the controllable delay cells 1002-1016. As shown in FIG. 11, the controllable delay cell can include PMOSFETs 1102, 1104, a P/N MOSFET pair 1106, and NMOSFETs 1108, 1110. The P/N MOSFET pair 1106 utilizes to receive an input clock signal IN. The PMOSFET 1102 and the NMOSFET 1108 respectively receive the biasing voltage $P_{bias}$ and $N_{bias}$. Thereby a delay version of the input clock signal IN, the delayed clock signal DIN is generated. The delay amount is related with the biasing voltage $P_{bias}$ and $V_{bias}$. However, please note that the circuit structure of the controllable delay cell is not limited to the circuit shown in FIG. 11, other circuits that can reach the same function can also be applied to the controllable delay cell.

Figure 12:
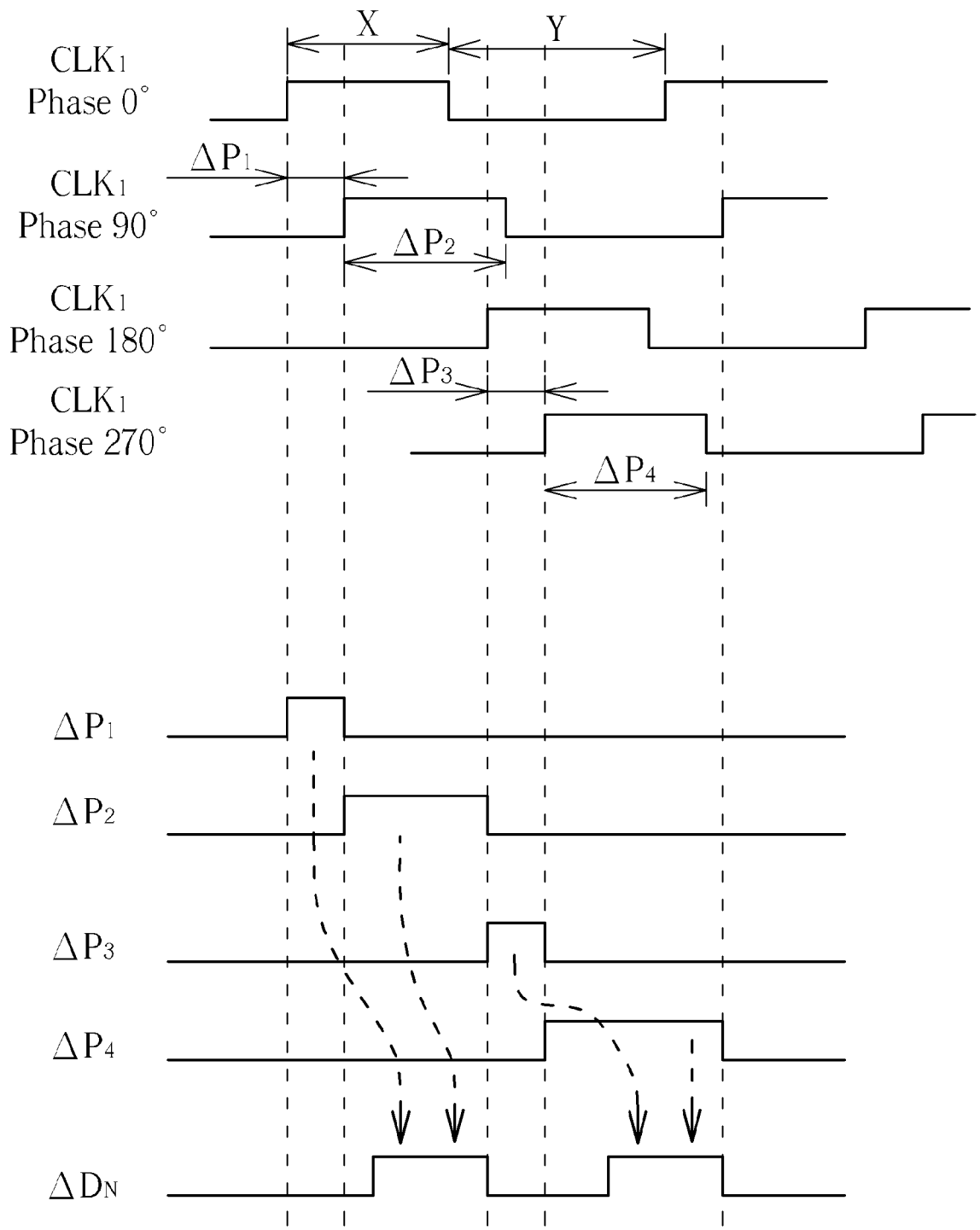
FIG. 12 is a schematic diagram illustrating the phase skew issue.

FIG. 12 is a schematic diagram illustrating the phase skew issue. As shown in FIG. 12, the phases of output clock signals $CLK_1$, $CLK_2$, $CLK_3$ and $CLK_4$ may drift due to various kinds of reasons. Accordingly, the phase difference signals $\Delta P_1$, $\Delta P_2$, $\Delta P_3$ and $\Delta P_4$ are ideally having the same phase interval, which means output clock signals $CLK_1$, $CLK_2$, $CLK_3$ and $CLK_4$ having the same phase difference, but practically not. A phase skew detection signal $\Delta D_N$ is utilized to indicate the skew difference of $\Delta P_1$, $\Delta P_2$, $\Delta P_3$ and $\Delta P_4$. The signal $\Delta D_N$ keeps low only when $\Delta P=\Delta P_2=\Delta P_3=\Delta P_4$ due to phase detector diff-pair configuration as indicated in FIG. 9. If the clock signals $CLK_1$, $CLK_2$, $CLK_3$ and $CLK_4$ are adjusted to such state. This state is called phase skew lock-in condition, which means phase skew is minimized within sensing resolution. It needs a huge circuit or complicated design to adjust the clock signals to phase skew lock-in condition in prior arts.

Figure 13:
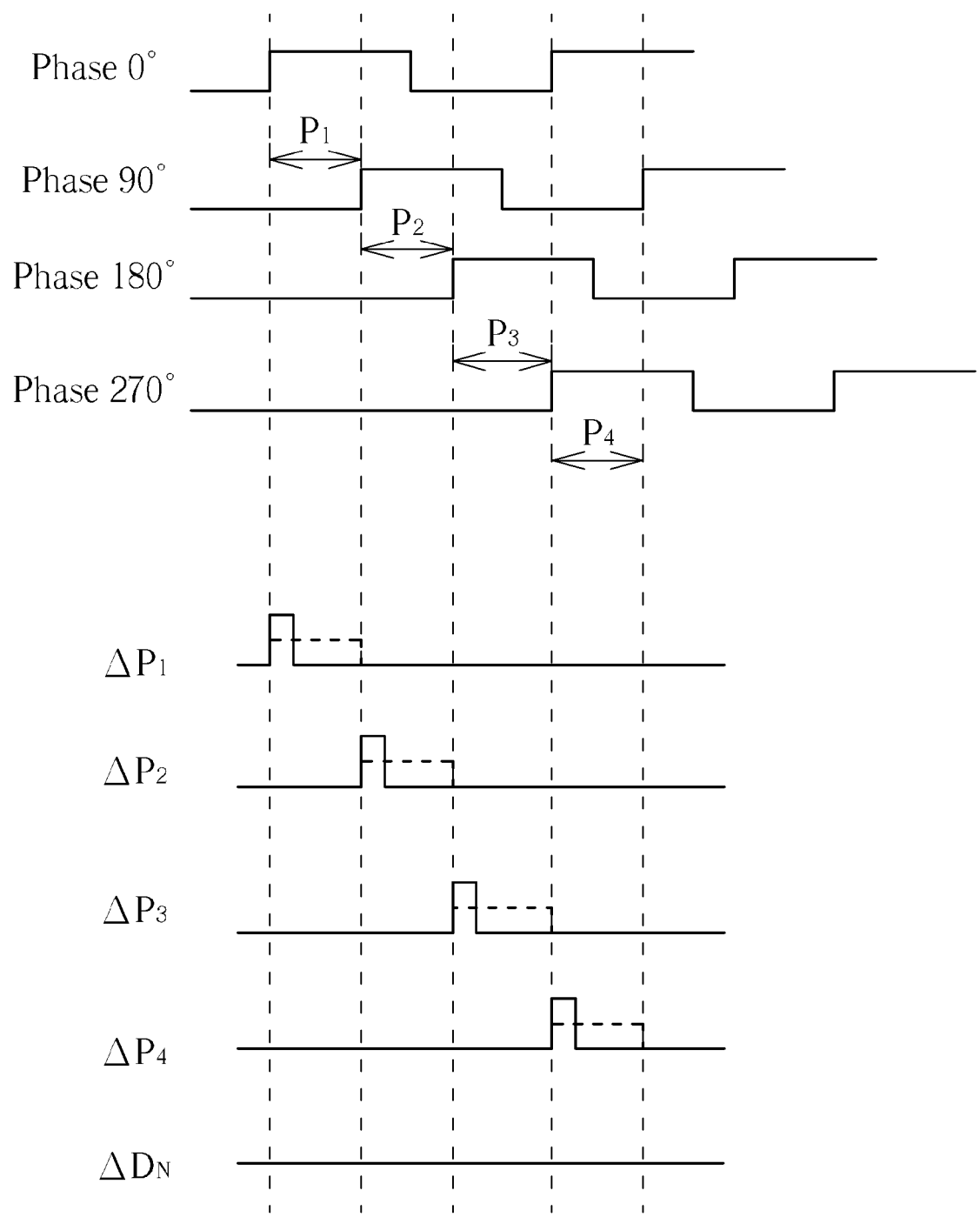
FIG. 13 is a schematic diagram illustrating a power down saving mode.

FIG. 13 is a schematic diagram illustrating a power down saving mode. In the power down saving mode, the phase skew difference is bypassed, ignoring phase-in-lock or not. As shown in FIG. 13, the regions $Y_1$, $Y_2$, $Y_3$ and $Y_4$ in the phase difference signals $\Delta P_1$, $\Delta P_2$, $\Delta P_3$ and $\Delta P_4$ indicate the real phase differences. After adjusting, the regions $Y_1$, $Y_2$, $Y_3$ and $Y_4$ will be adjusted to the pulses $X_1$, $X_2$, $X_3$ and $X_4$. That is, the differences in the phase difference signals $\Delta P_1$, $\Delta P_2$, $\Delta P_3$ and $\Delta P_4$ will be adjusted to be the same value, even if the phase difference still exist between the output clock signals. By this way, the phase skew detecting signal $\Delta D_N$ can be kept at a low level, and the phase skew issue can be ignored. The areas of pulses $X_1$, $X_2$, $X_3$ and $X_4$ can be determined by pull-up/pull-down standby current amount. Such condition is named an ultra low power lock-in condition.

Figure 14:
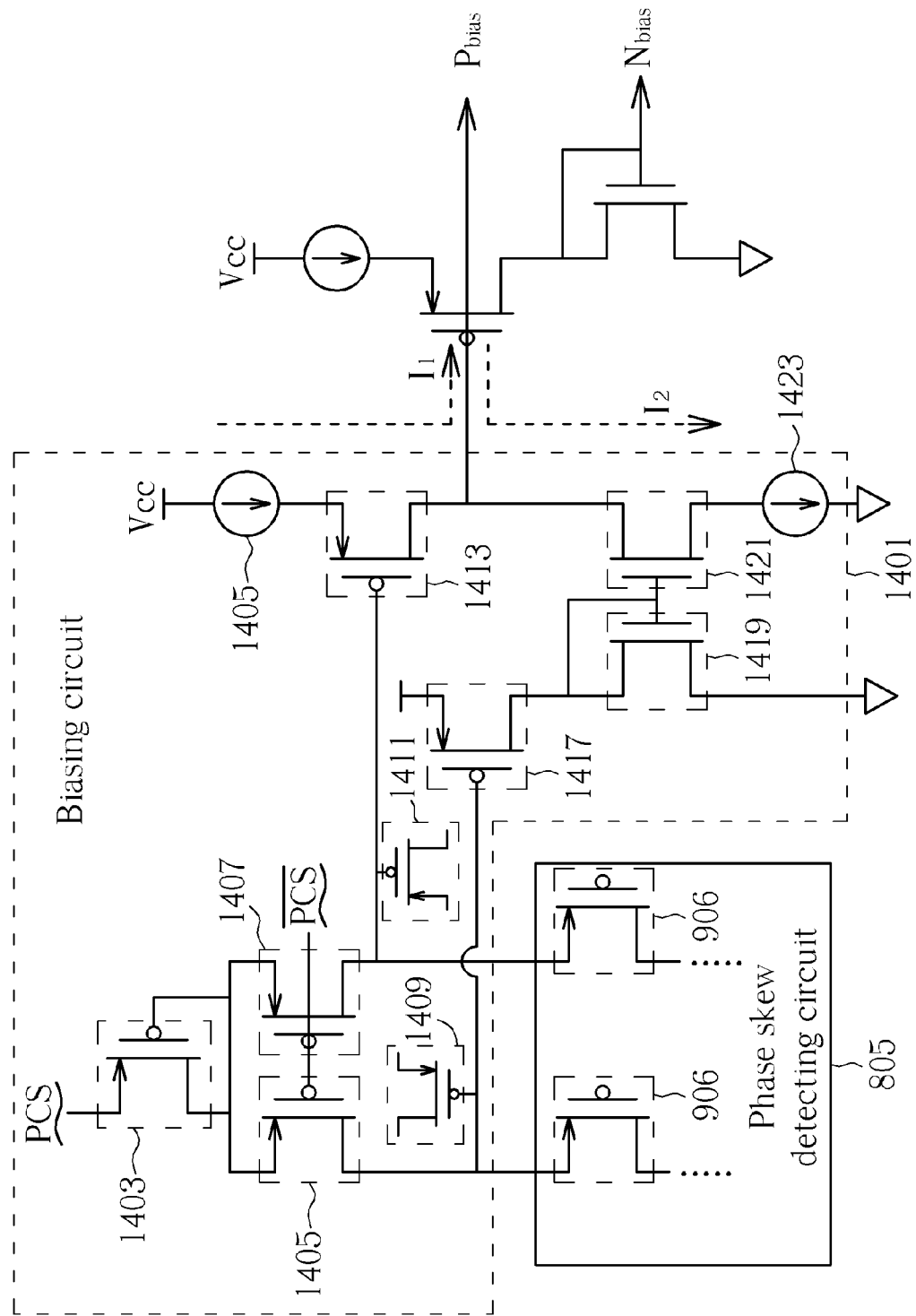
FIG. 14 is a circuit diagram illustrating a biasing circuit that can provide standby pull-up/pull-down current.

FIG. 14 is a circuit diagram illustrating a biasing circuit that can provide standby pull-up/pull-down current. Such biasing circuit is incorporated with the phase skew detecting circuit 805 shown in FIG. 9. As shown in FIG. 14, the biasing circuit 1401 is coupled to drain terminals of the PMOSFETs 906 and 908. In this embodiment, the biasing circuit 1401 can provide steady $P_{bias}$ and $N_{bias}$ via driving small equal pull-up/pull-down standby currents through $P_{bias}$ node ($I_1$, $I_2$). By this way, the ultra low power lock-in condition can be performed. Also, in this embodiment, the biasing circuit 1401 includes the PMOSFETs 1403, 1405, 1409, 1413 and 1417, current sources 1415, 1423 and NMOSFETs 1419, 1421. The PMOSFET 1403 and 1407 serve to receive power down control signal PCS and $\overline{PCS}$, to determine if the power down saving mode starts or not. Accordingly, the PMOSFETs 1403, 1405, and 1407 can be regarded as a switch circuit. Please note that some devices of the phase skew detecting circuit 805 are omitted for brevity here.

Besides, the PMOSFET 1413, the NMOSFETs 1419, 1421 and the current sources 1415, 1423, are arranged as a circuit providing circuit, to provide the current $I_1$ or drain the current $I_2$. However, other circuits that can provide the same function can also be applied as the biasing circuit.

Figure 15:
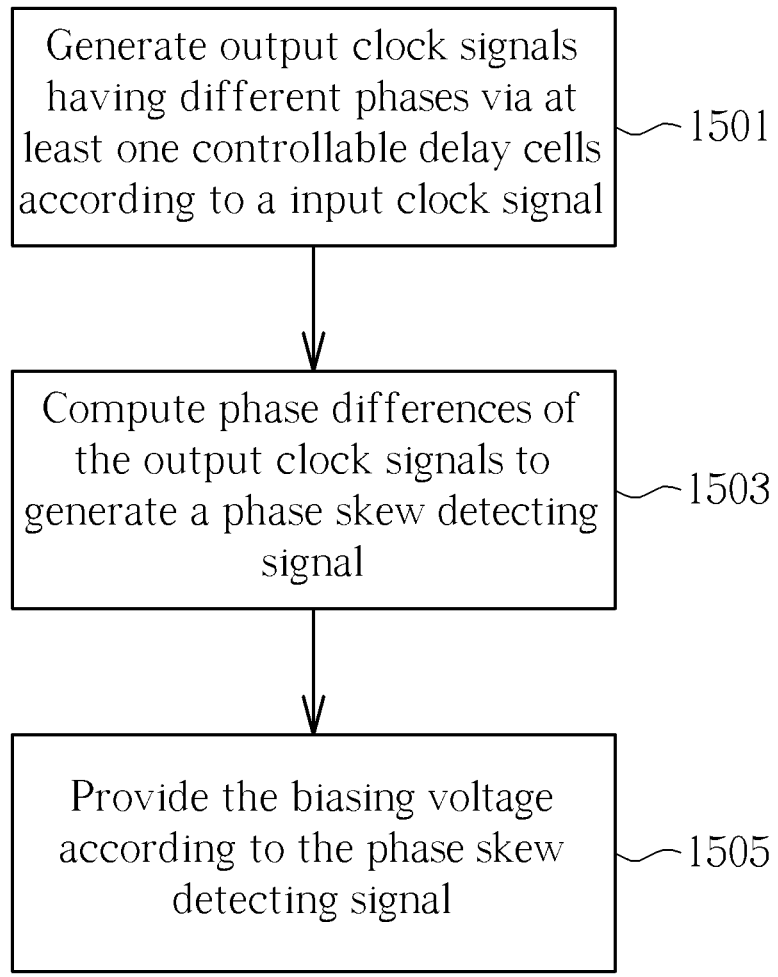
FIG. 15 is a flow chart illustrating the steps of a multiphase clock signal generating method according to another embodiment of the present application.

Via above-mentioned embodiments, a multiphase generating method as shown in FIG. 15 can be acquired, the following steps are included:

Step 1501

Generate output clock signals having different phases via at least one controllable delay cells according to a input clock signal, wherein delay amount of the controllable delay cells are determined by a biasing voltage.

Step 1503

Compute phase differences of the output clock signals to generate a phase skew detecting signal.

Step 1505

Provide the biasing voltage according to the phase skew detecting signal.

Other detail characteristics are already described as above-mentioned, thus are omitted for brevity here.

In view of above-mentioned embodiments, accurate multiphase clock signals can be generated by utilizing a few devices. Circuit region and power consumption can decrease. Also, the solution of the multi-phase clock signals can be randomly selected via changing the integer N. Besides, the frequency of the multi-phase clock signals is only determined by external clock signal and will not be affected by supply voltage noises. Additionally, via utilizing the phase skew computing mechanism according to the present application, the phase skew different can be directly pass by regardless if the multi-phase clock signals are in the phase-in-lock condition or not. Additionally, by utilizing feedback biasing voltage, high phase skew accuracy through ultra wide range operating frequency can be acquired.

Those skilled in the art will readily observe that numerous modifications and alterations of the device and method may be made while retaining the teachings of the invention.

What is claimed is:

1. A multi-phase clock signal generator, comprising:
a ring phase shifting loop, having a plurality of output terminals and phase shifting units, for phase-shifting a input clock signal to generate output clock signals with different phases, wherein the output clock signals are respectively output at different output terminals respectively located between the phase shifting units;
wherein the phase shifting units are phase mixing units.

2. The multiphase generator of claim 1, wherein the ring phase shifting loop comprises a plurality of loading match components coupled to the output terminals.

3. The multiphase generator of claim 1, wherein the ring phase shifting loop comprises a plurality of latches coupled to the output terminals.

4. The multiphase generator of claim 1, wherein a number of the phase shifting units is twice a number of the output terminals.

5. The multiphase generator of claim 1, wherein at least two phase latching units are located between two output terminals.

6. A multi-phase clock signal generating method, comprising:
(a) providing a plurality of phase shifting units to form a ring phase shifting loop;
(b) utilizing the phase shifting units to phase-shift a input clock signal to generate output clock signals with different phases; and
(c) selecting at least one part of output terminals respectively between the phase shifting units to output the selected output clock signals;
wherein the step (b) utilizes phase mixing units as the phase-shifting units.

7. The multi-phase clock signal generating method of claim 6, further comprising: providing a plurality of loading match components coupled to the output terminals.

8. The multi-phase clock signal generating method of claim 6, further comprising: providing a plurality of latches coupled to the output terminals.

9. The multi-phase clock signal generating method of claim 6, wherein a number of the phase shifting units is twice a number of the output terminals.

10. The multi-phase clock signal generating method of claim 6, further comprising: providing at least two phase latching units are located between two output terminals.

11. A multi-phase clock signal generator, comprising:
a ring phase shifting loop, including a plurality of controllable delay cells, for generating output clock signals having different phases via the controllable delay cells according to a input clock signal, wherein delay amount of the controllable delay cells are determined by a biasing voltage;
a phase skew detecting circuit, for computing phase differences of the output clock signals to generate a phase skew detecting signal; and
a biasing circuit, for providing the biasing voltage according to the phase skew detecting signal;
wherein the biasing circuit provides steady biasing voltage in a power down saving mode, which maintains prior bias information before entering power down.

12. The multi-phase clock signal generator of claim 11, wherein the controllable delay cell delays a clock signal to generate a delayed clock signal and includes:
a P/N MOSFET pair, for receiving a clock signal;
a first PMOSFET, for receiving the biasing voltage at a gate terminal thereof;
a second PMOSFET, having a drain terminal coupled to a drain terminal of the first PMOSFET;
a first NMOSFET, for receiving the biasing voltage at a gate terminal thereof; and
a second PMOSFET, having a source terminal coupled to a source terminal of the first PMOSFET, wherein the delayed clock signal are formed at the gate terminal of the second PMOSFET, and the gate terminal of the second NMOSFET.

13. The multi-phase clock signal generator of claim 11, wherein the phase skew detecting circuit comprises a plurality of detecting circuits, for respectively receiving one or two or more different output clock signals to compute the phase difference of the received at least one output clock signal.

14. The multi-phase clock signal generator of claim 11, wherein the detecting circuit includes a PMOSFET and a NMOSFET, wherein a drain terminal of the PMOSFET is coupled to a drain terminal of the NMOSFET, where the output clock signal are received at a gate terminal of the PMOSET, and a gate terminal of the NMOSET of the other detecting circuit.

15. The multi-phase clock signal generator of claim 11, wherein the biasing circuit is incorporated with the phase skew detecting circuit, and the biasing voltage has a first biasing voltage and a second biasing voltage, where the biasing circuit holding the first biasing voltage and the second biasing voltage steady via providing standby pull-up/pull-down current through a node where the first biasing voltage is output.

16. The multi-phase clock signal generator of claim 15, wherein the biasing circuit includes:
a switch circuit, for receiving a power down control signal;
a current providing circuit, controlled by the switch circuit to provide the standby pull-up/pull-down current.

17. The multi-phase clock signal generator of claim 16, wherein the controllable delay cell delays a clock signal to generate a delayed clock signal and includes:
a P/N MOSFET pair, for receiving a clock signal;
a first PMOSFET, for receiving the biasing voltage at a gate terminal thereof;
a second PMOSFET, having a drain terminal coupled to a drain terminal of the first PMOSFET;
a first NMOSFET, for receiving the biasing voltage at a gate terminal thereof; and
a second PMOSFET, having a source terminal coupled to a source terminal of the first PMOSFET, wherein the delayed clock signal are formed at the gate terminal of the second PMOSFET, and the gate terminal of the second NMOSFET;
wherein the switch circuit includes:
a third PMOSFET, having a source terminal receiving the power down control signal;
a fourth PMOSFET, having a source terminal coupled to a drain terminal of the third PMOSFET;
a fifth PMOSFET, having a source terminal coupled to the drain terminal of the third PMOSFET;
wherein gate terminals of the fourth and fifth PMOSFETs receive a inverted version of the power down control signal, where the drain terminals of the fourth PMOSFET and the fifth PMOSFET are respectively coupled to the source terminals of the second PMOSFET and the third PMOSFET.

18. A multi-phase clock signal generating method, comprising:
generating output clock signals having different phases via at least one controllable delay cells according to a input clock signal, wherein delay amount of the controllable delay cells are determined by a biasing voltage;

computing phase differences of the output clock signals to generate a phase skew detecting signal; and providing the biasing voltage according to the phase skew detecting signal;

wherein the biasing voltage has a first biasing voltage and a second biasing voltage, the multiphase generating method further comprising: holding the first biasing voltage and the second biasing voltage steady via providing standby pull-up/pull-down current through a node where the first biasing voltage is output.

19. A multi-phase clock signal generator, comprising:

a ring phase shifting loop, including a plurality of controllable delay cells, for generating output clock signals having different phases via the controllable delay cells according to a input clock signal, wherein delay amount of the controllable delay cells are determined by a biasing voltage;

a phase skew detecting circuit, for computing phase differences of the output clock signals to generate a phase skew detecting signal; and a biasing circuit, for providing the biasing voltage according to the phase skew detecting signal, wherein the biasing circuit provides steady biasing voltage in a power down saving mode, which maintains prior bias information before entering power down.

20. A multi-phase clock signal generator, comprising:

a ring phase shifting loop, including a plurality of controllable delay cells, for generating output clock signals having different phases via the controllable delay cells according to a input clock signal, wherein delay amount of the controllable delay cells are determined by a biasing voltage;

a phase skew detecting circuit, for computing phase differences of the output clock signals to generate a phase skew detecting signal; and a biasing circuit, for providing the biasing voltage according to the phase skew detecting signal;

wherein the controllable delay cell delays a clock signal to generate a delayed clock signal and includes:

a P/N MOSFET pair, for receiving a clock signal;

a first PMOSFET, for receiving the biasing voltage at a gate terminal thereof;

a second PMOSFET, having a drain terminal coupled to a drain terminal of the first PMOSFET;

a first NMOSFET, for receiving the biasing voltage at a gate terminal thereof; and a second PMOSFET, having a source terminal coupled to a source terminal of the first PMOSFET, wherein the delayed clock signal are formed at the gate terminal of the second PMOSFET, and the gate terminal of the second NMOSFET.

21. A multi-phase clock signal generator, comprising:

a ring phase shifting loop, including a plurality of controllable delay cells, for generating output clock signals having different phases via the controllable delay cells according to a input clock signal, wherein delay amount of the controllable delay cells are determined by a biasing voltage;

a phase skew detecting circuit, for computing phase differences of the output clock signals to generate a phase skew detecting signal; and a biasing circuit, for providing the biasing voltage according to the phase skew detecting signal;

wherein the phase skew detecting circuit comprises a plurality of detecting circuits, for respectively receiving one or two or more different output clock signals to compute the phase difference of the received at least one output clock signal.

22. A multi-phase clock signal generator, comprising:

a ring phase shifting loop, including a plurality of controllable delay cells, for generating output clock signals having different phases via the controllable delay cells according to a input clock signal, wherein delay amount of the controllable delay cells are determined by a biasing voltage;

a phase skew detecting circuit, for computing phase differences of the output clock signals to generate a phase skew detecting signal; and a biasing circuit, for providing the biasing voltage according to the phase skew detecting signal;

wherein the detecting circuit includes a PMOSFET and a NMOSFET, wherein a drain terminal of the PMOSFET is coupled to a drain terminal of the NMOSFET, where the output clock signal are received at a gate terminal of the PMOSET, and a gate terminal of the NMOSET of the other detecting circuit.

* * * * *